US011665866B1

(12) United States Patent
Lin et al.

(10) Patent No.: US 11,665,866 B1
(45) Date of Patent: May 30, 2023

(54) COOLING SYSTEM WITH A BOOSTER

(71) Applicant: Amazon Technologies, Inc., Seattle, WA (US)

(72) Inventors: Zhiyong Lin, Issaquah, WA (US); Peter Ross, Olympia, WA (US)

(73) Assignee: Amazon Technologies, Inc., Seattle, WA (US)

(*) Notice: Subject to any disclaimer, the term of this patent is extended or adjusted under 35 U.S.C. 154(b) by 232 days.

(21) Appl. No.: 17/110,134

(22) Filed: Dec. 2, 2020

(51) Int. Cl.
*H05K 7/20* (2006.01)

(52) U.S. Cl.
CPC ......... *H05K 7/20836* (2013.01); *H05K 7/202* (2013.01); *H05K 7/20754* (2013.01)

(58) Field of Classification Search
USPC .......................................................... 700/300
See application file for complete search history.

(56) References Cited

U.S. PATENT DOCUMENTS

| | | | | |
|---|---|---|---|---|
| 5,086,829 A | * | 2/1992 | Asakawa | H05K 7/20281 361/699 |
| 7,447,026 B2 | * | 11/2008 | Murakami | H05K 7/20754 165/80.4 |
| 2008/0101023 A1 | | 5/2008 | Hsu | |
| 2013/0050931 A1 | * | 2/2013 | Heiland | H05K 7/20827 361/679.53 |
| 2013/0091880 A1 | * | 4/2013 | Inadomi | F25B 23/006 62/190 |
| 2016/0205810 A1 | * | 7/2016 | Marshall | H05K 7/20781 165/11.2 |
| 2019/0113247 A1 | | 4/2019 | Lepoudre et al. | |
| 2020/0400348 A1 | | 12/2020 | Sakuma et al. | |

OTHER PUBLICATIONS

U.S. Appl. No. 17/119,746, filed Dec. 11, 2020 Titled: "Cooling System With Leakage Tolerance".

* cited by examiner

*Primary Examiner* — Emilio J Saavedra
(74) *Attorney, Agent, or Firm* — Kilpatrick Townsend & Stockton LLP

(57) ABSTRACT

An environmental control system is provided. The environmental control system can include a cooling device and a heating device. The cooling device can lower the temperature of fluid contained within a cold reservoir and the heating device can raise the temperature of fluid contained within a hot reservoir.

19 Claims, 5 Drawing Sheets

COOLING SYSTEM WITH A BOOSTER

BACKGROUND

A data center is a facility used to house a collection of data center electronic components such as computer servers and associated components, such as network hardware. The collection of computer servers is often called a "server cluster" or "server farm," and is designed to accomplish server needs far beyond the capability of a single machine. The networking hardware typically includes network switches and/or routers which enable communication between the different parts of the server farm and the users of the server farm.

Server farms are commonly used for cluster computing, web services, remote data storage, web hosting, and other web services. Server farms are increasingly being used by enterprises instead of, or in addition to, mainframe computers. As the demand for server farms continues to increase, a need exists to limit the cost of operating a data center. Often, a pertinent part of the cost of operating a data center relates to the costs of cooling the electronic components. Such costs may be incurred by running cooling systems that cool the electronic components.

BRIEF DESCRIPTION OF THE DRAWINGS

Various embodiments in accordance with the present disclosure will be described with reference to the drawings, in which.

DETAILED DESCRIPTION

Figure 1:
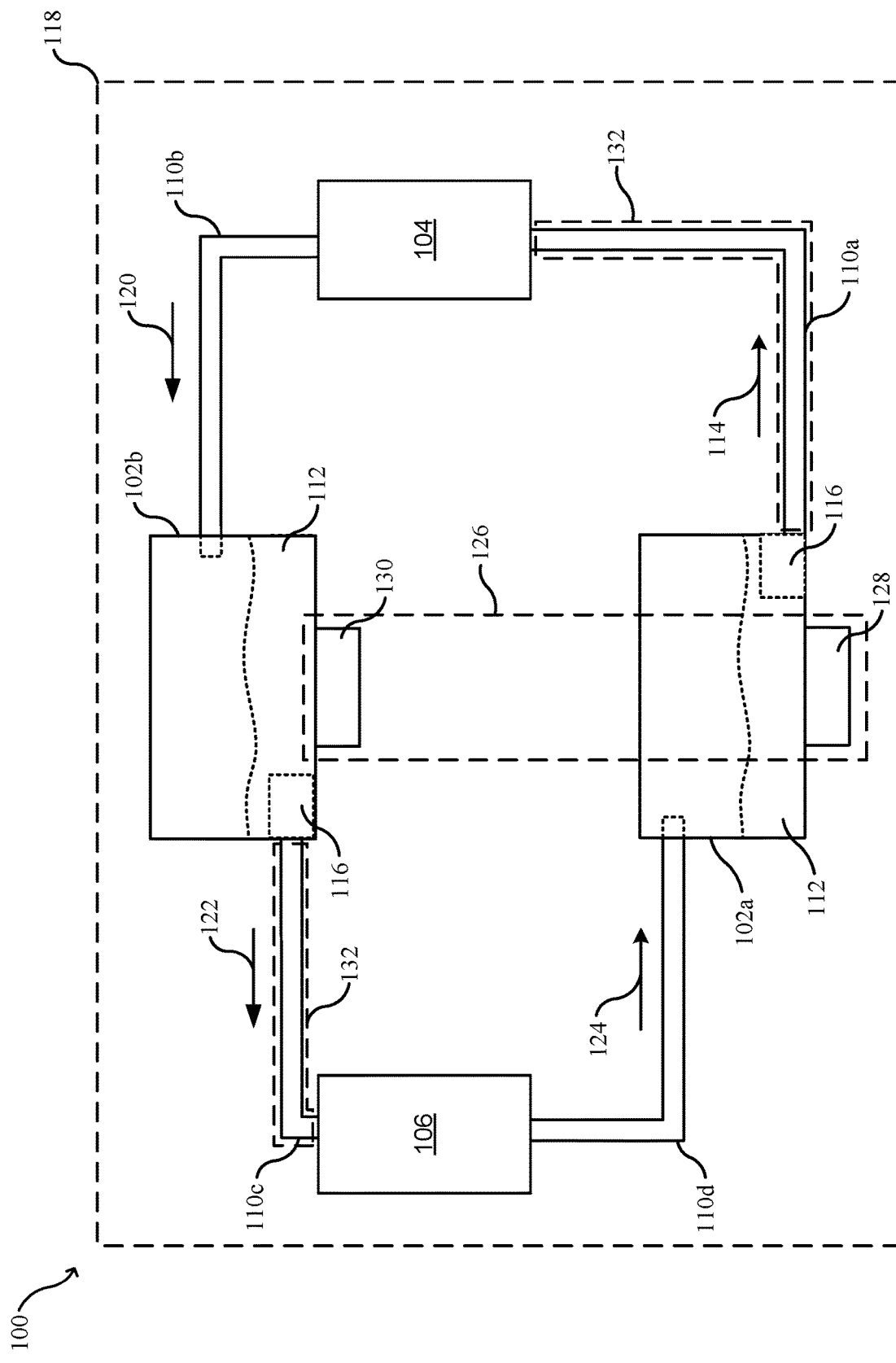
FIG. 1 illustrates a simplified diagram of an example environmental control system in accordance with various embodiments.

Examples herein are directed to, among other things, systems and techniques relating to an environmental control system, for example, which may be particularly suited for use in a data center environment. The techniques described herein may be implemented by any environmental control system, but particular examples described herein can be an environmental control system with a booster system. The environmental control system can include a heat absorption portion (e.g., a cool portion) and a heat rejection portion (e.g., a hot portion). A booster system (e.g., a temperature differential system) can be used to increase the temperature of the heat absorption portion and decrease the temperature of the heat rejection portion. The difference between the temperatures of the hot and cold portions of the environmental control system can increase the efficiency of the cooling system. The booster system can be activated in response to a change in temperature in the data center. For example, the booster system can cause an increase in the temperature difference to boost the cooling power of the environmental control system.

Turning now to a particular example, a data center can include an environmental cooling system with a booster system. The environmental control system can include a heat absorption device, a heat rejection device, and hot and cold fluid reservoirs. The fluid (e.g., cold fluid) can flow from the cold reservoir to the heat absorption device, which can use the fluid to cool the air in the data center. The heat absorption device cooling the air can cause the fluid to increase in temperature (e.g., the heat absorption device can heat the fluid). The hot fluid can flow from the heat absorption device to the hot fluid reservoir and from the hot fluid reservoir to the heat rejection device. The heat rejection device can lower the temperature of the fluid (e.g., cool the fluid), for example, by rejecting hot air into the environment outside the data center. The cooled fluid can flow from the heat rejection device to the cold fluid reservoir. A booster system (e.g., a trim cooling system) can be used to increase the temperature differential between the hot and cold fluid (e.g., by increasing the temperature of the fluid in the hot reservoir and/or by decreasing the temperature of the fluid in the cold reservoir). The booster system can include an evaporator positioned in the cold reservoir that extracts heat from the cold fluid (e.g., causing the temperature of the cold fluid to decrease) and sends the heat to a condenser positioned in the hot reservoir. The condenser can cause the temperature of the fluid in the hot fluid reservoir to increase. The increase in the temperature difference between the hot and cold fluid can increase the efficiency of the cooling system (e.g., by increasing the efficiency on the dry cooler and/or by allowing for more heat extraction from the hot fluid).

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Turning now to the figures, FIG. 1 is a simplified diagram of an example environmental control system 100. The environmental control system 100 can include a heat absorption device 104 (e.g., a first fan coil unit), a heat rejection device 106 (e.g., a second fan coil unit), and one or more reservoirs 102 (e.g., a cold reservoir 102a and a hot reservoir 102b) coupled to one another with conduits 110 (e.g., pipes). Fluid 112 (e.g., water and/or refrigerant) can flow from the cold reservoir 102a to the heat absorption device 104 (e.g., via conduit 110a in direction 114). For example, the fluid 112 can be pumped from the cold reservoir 102a using, for example, pumps 116 positioned in the cold reservoir 102a. The fluid 112 can be at a temperature lower than an ambient temperature of an environment 118 (e.g., in this figure the environment is delineated by dashed lines). The heat absorption device 104 can receive the fluid 112 and can use the fluid 112 to cool the air in the environment 118. For example, the heat absorption device 104 can intake air (e.g., warm air) from the environment 118, cool the air using the fluid 112, and output cold air back into the environment 118. However, the heat absorption device 104 may intake and/or output air into a secondary environment. For example, the heat absorption device 104 can intake air from a secondary environment, cool the air, and then output the air into the secondary environment. Cooling of the air can cause the fluid 112 to increase in temperature (e.g., to a temperature above the temperature of the fluid 112 entering the heat absorption device 104) and become "hot" refrigerant.

The heat absorption device 104 can output the hot fluid 112 to the hot reservoir 102b (e.g., via conduit 110b in direction 120). The hot reservoir 102b can output the hot fluid 112 to the heat rejection device 106 (e.g., via conduit 110c in direction 122). For example, the hot reservoir 102b can pump the fluid 112 to the heat rejection device 106 using a pump 116. The heat rejection device 106 can lower the temperature of the fluid 112, for example, by removing heat from the fluid 112. The heat removed from the fluid 112 can be removed from the environmental control system 100 (e.g., by venting or otherwise removing the hot air from the environment 118). The low temperature fluid 112 can flow from the heat rejection device 106 to the cold reservoir 102a (e.g., via conduit 110d in direction 124). In various embodiments, the heat absorption device 104 and/or the heat rejection device 106 can be or include a fan coil unit. The fan coil unit can include a heat exchanger and a fan. The heat exchanger can be used to change the temperature of the fluid 112 flowing through the fan coil unit and the fan can be used to circulate the air (e.g., through the environment 118).

The environmental control system 100 can include high pressure areas 132. The high pressure areas 132 can be limited to certain portions of the environmental control system 100. For example, the high pressure areas 132 can be limited to the conduits 110 between the pumps 116 and the heat absorption device 104 and/or the heat rejection device 106. The remainder of the system 100 can be at a lower pressure than the high pressure areas 132. Limiting the high pressure areas 132 can limit high pressure leaks in the system. As discussed in reference to FIG. 2, the low pressure leaks can be contained by containment areas. The containment areas can include drains that can direct the fluid 112 back into the reservoirs 102.

In various embodiments, the environmental control system 100 can include a booster system 126 that can increase the efficiency and/or the cooling power of the environmental control system 100 (e.g., by increasing the temperature differential between the hot reservoir 102b and the cold reservoir 102a). For example, the booster system 126 can be or include a trim cooling system that can be used increase cooling in the environmental control system 100. The booster system 126 can increase the temperature differential by increasing the temperature of the hot reservoir 102b and decreasing the temperature of the cold reservoir 102a. For example, the booster system 126 can remove heat from cold reservoir 102a and transfer the heat to the hot reservoir 102b. In various embodiments, the booster system 126 can include a cooling device 128 and/or a heating device 130. The cooling device 128 can remove heat from (e.g., cool) the cold reservoir 102a and add heat (e.g., heat) the hot reservoir 102b. The cooling device 128 and the heating device 130 can be connected to one another, for example, via one or more conduits 110.

In traditional environmental control systems, increasing the temperature differential between the hot reservoir 102b and the cold reservoir 102a can include adding additional in-line cooling devices and/or by adding additional cooling devices that can cause inefficiencies in the system. Adding in-line devices and/or cooling devices can cause unwanted failures in the system. For example, failure of the in-line devices and/or the cooling devices can cause the system to fail. In an environmental control system 100 with a booster system 126, the booster system 126 can be used to increase the temperature differential in the environmental control system 100. The booster system 126 can increase the temperature differential, for example, by using devices (e.g., a cooling device 128 and a heating device 130) that are not in-line in the system. Using devices that do not need to be installed in-line can reduce possible failure modes in the environmental control system 100. For example, the devices can fail and the environmental control system 100 can continue to operate, for example, at a lower efficiency. Additionally or alternatively, the booster system 126 can be activated based on the cooling needs of the environmental control system 100. For example, if additional cooling is needed, the booster system 126 can be used to increase the cooling ability of the environmental control system 100.

Figure 2A:
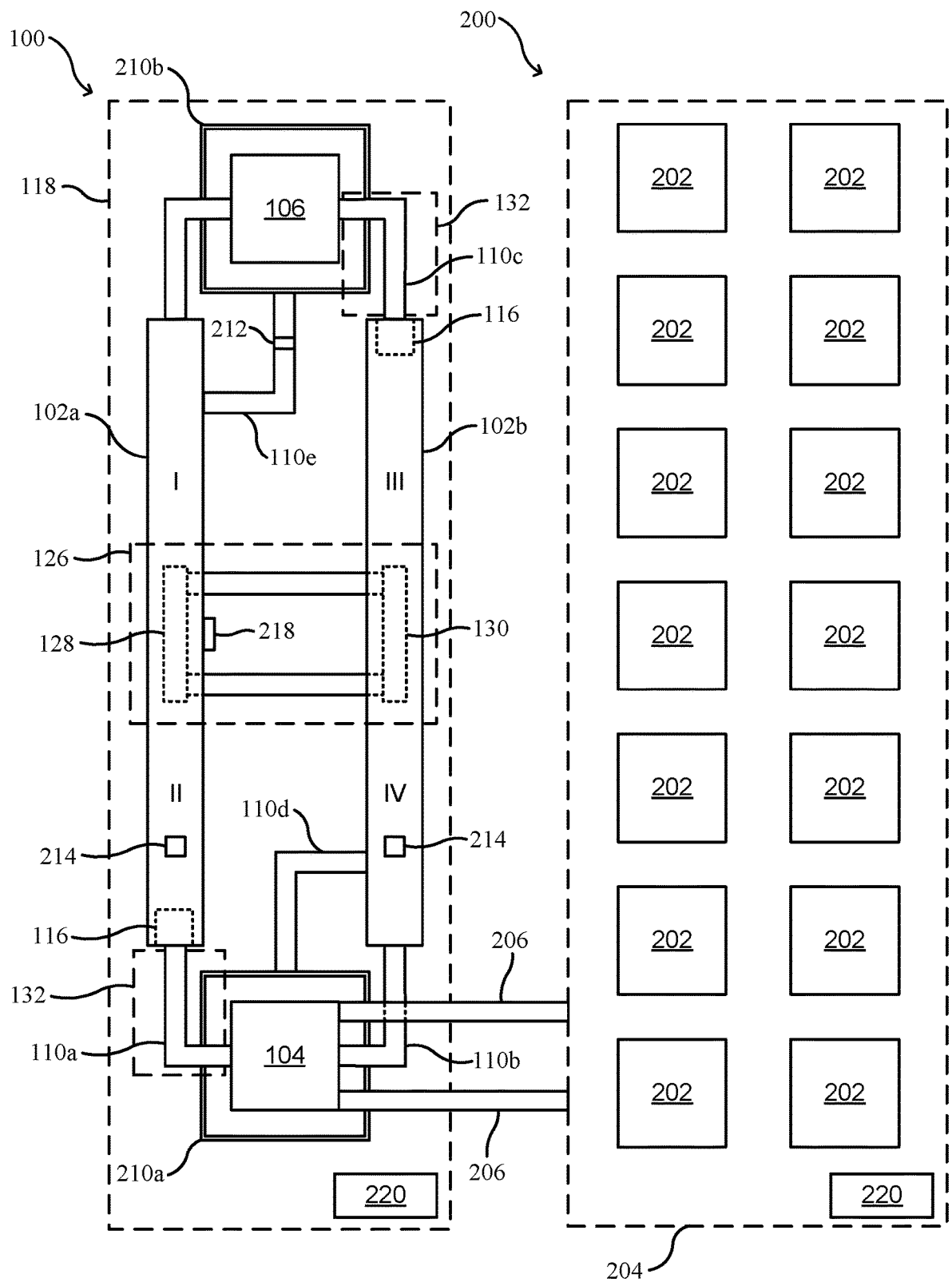
FIGS. 2A and 2B illustrate the environmental control system of FIG. 1 for use with environments, in accordance with various embodiments.
Figure 2B:
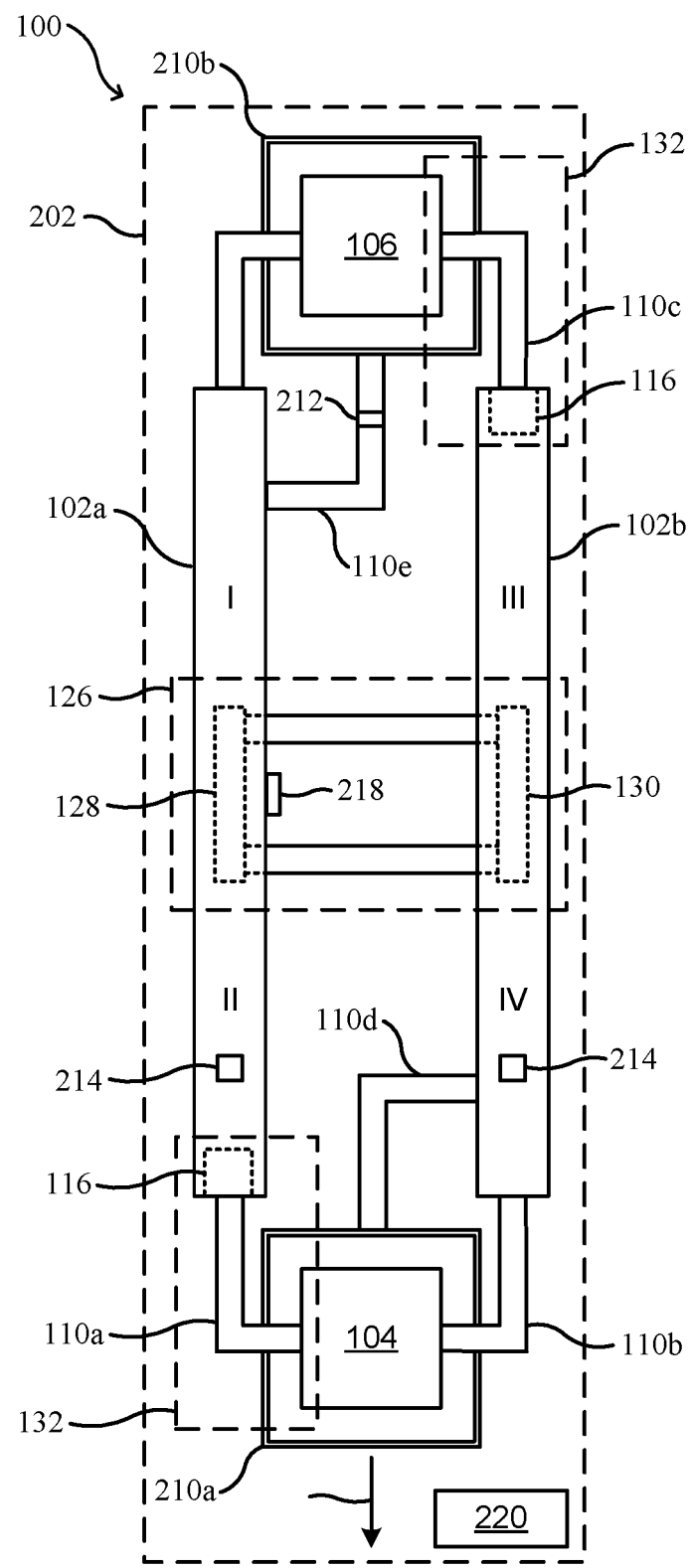

FIGS. 2A and 2B illustrate the environmental control system 100 of FIG. 1 for use with one or more environments. FIG. 2A shows an environmental control system 100 for use with an external environment, for example, a data center 200. FIG. 2B illustrates the environmental control system 100 positioned for cooling of a contained or semi-contained environment, for example, a server rack 202. The data center 200 can include electronic components, for example, server racks 202 positioned within a climate controlled environment 204 (as shown in dashed lines). The data center 200 can be or include a building containing one or more rooms. Each of the rooms may have their own environmental control system 100 or several rooms may share an environmental control system 100.

The environment 204 can have an associated pressure and temperature (e.g., an ambient pressure and an ambient temperature respectively). The pressure and/or the temperature of the environment 204 can differ from the pressure and/or the temperature of the environment outside the data center 200. For example, the ambient temperature of the environment 204 may be at a lower temperature than the temperature outside of the data center 200.

The server racks 202 can be positioned in the data center 200. The server racks 202 can be positioned in a designated area, for example, on the floor of the data center 200. The server racks 202 can include various electronic components. In various embodiments, the server racks 202 can be turned sideways, and may require some spacing between the server racks 202, for example, exhausting of the servers. Whereas servers which exhaust out through a back exhaust fan can be installed immediately adjacent to one another. The differentiation in these two structures may warrant some alterations to placement of climate control system elements relative to a given server rack 202, but in general, embodiments herein can utilize the same structure of climate control system components for server racks 202 containing different electronic components.

The environmental control system 100 can include one or more reservoirs 102 connected to a heat absorption device 104 and a heat rejection device 106 via conduits 110. The reservoirs 102 can be or include a container for containing fluid 112. For example, the reservoirs 102 can include a watertight container that can hold the fluid 112. The reservoirs 102 can include various openings (e.g., inputs and outputs). The reservoirs 102 can be sized to contain more fluid 112 than the system needs to operate. For example, the reservoirs 102 can be sized to hold fluid 112 even when the rest of the system is completely filled with fluid 112. The reservoirs 102 can include dimensions that allow the fluid 112 to remain at a predetermined level. For example, the reservoirs 102 can be dimensioned to allow the fluid 112 to remain below input openings in the reservoirs 102. The fluid 112 can additionally or alternatively be at a level that allows a portion of the fluid 112 to return to the reservoirs 102 at a slower rate. For example, leaking fluid 112 may return to the reservoirs 102 slower than fluid 112 flowing through system. The fluid 112 in the reservoirs 102 can be used to continue the operation of the environmental control system 100 while the slower flowing fluid 112 returns to the reservoirs 102. The reservoirs 102 can be or include metal, rubber, or similar material.

In various embodiments, the environmental control system 100 can include a cold reservoir 102a that can contain fluid 112 at a temperature that is lower than the fluid 112 contained in a hot reservoir 102b (e.g., the environmental control system 100 can include a cold reservoir 102a and a hot reservoir 102b). The reservoirs 102 can contain a portion of the fluid 112 used in the environmental control system 100. For example, the fluid 112 can be distributed among the reservoirs 102 when the environmental control system is in operation. The reservoirs 102 can have approximately the same level of fluid 112 or one reservoir 102 may have more fluid 112 than the other.

The reservoirs 102 can be positioned at various locations in the data center 200. For example, the cold reservoir 102a can be positioned above the hot reservoir 102b. However, the reservoirs 102 can be positioned side by side or the hot reservoir 102b can be positioned above the cold reservoir 102a. In some embodiments, the reservoirs 102 can be contained in a single container. For example, a container can contain multiple compartments where one or more of the compartments is a reservoir 102. In further embodiments, the reservoirs 102 can be an open reservoir, for example, by having an opening 214 that can allow the pressure in the interior of the reservoir 102 to be similar to or the same as the pressure in the environment 204.

The reservoirs 102 can have various portions (e.g., the cold reservoir 102a can have quadrants I and II and the hot reservoir 102b can have quadrants III and IV). The portions can be separated by one or more components of the booster system 126. For example, the quadrants I and II can be separated by the cooling device 128 and the quadrants III and IV can be separated by the heating device 130. The quadrants can have fluid 112 at different temperatures. For example, the fluid 112 in quadrant I can be at a higher temperature than the fluid 112 in quadrant II. Similarly, the fluid 112 in quadrant III can be at a higher temperature than the fluid 112 in quadrant IV. The temperature of the fluid 112 can be changed by the booster system 126 (e.g., by the cooling device 128 and the heating device 130). For example, as the fluid 112 travels between the quadrants (e.g., through the booster system 126) the booster system 126 can heat and/or cool the fluid 112.

The booster system 126 can change the temperature of the fluid 112 in the environmental control system 100. For example, the booster system 126 can change the temperature of the fluid 112 in the reservoirs 102. The booster system 126 can include a cooling device 128 and/or a heating device 130. The cooling device 128 can be used to lower the temperature of the fluid 112 in the cold reservoir 102a. The heating device 130 can be used to raise the temperature of the fluid 112 in the hot reservoir 102b. In various embodiments, the cooling device 128 and/or the heating device 130 can be partially or fully submerged in the fluid 112 (e.g., within the reservoirs 102). For example, the cooling device 128 can be or include an evaporator submerged in the cold reservoir 102a and/or the heating device 130 can be or include a condenser submerged in the hot reservoir 102b. The cooling device 128 and/or the heating device 130 can additionally or alternatively be positioned on the outside of the reservoirs 102. The booster system 126 can be or include a condenser, an evaporator, a compressor, a metering device, an expansion valve, a direct expansion cooling unit, a thermoelectric cell, a Peltier device, a sterling engine, a heat pump, and/or any device suitable for cooling and/or heating the fluid 112.

In various embodiments, the booster system 126 can include a sensor 218 positioned within the data center 200. The sensor 218 can detect a temperature associated with the environment 204. The temperature detected by the sensor 218 can be used to determine when to activate the booster system 126. For example, the sensor 218 can detect a rise in the temperature in the environment 204 and the booster system 126 can be activated to increase the cooling power of the environmental control system 100.

The fluid 112 can be or include fluid that can absorb and/or expel heat. For example, the fluid 112 can have properties that are optimized for heat absorption. In various embodiments, the fluid 112 can be or include water, fluid, glycol, alcohol, and/or any suitable fluid for use in an environmental control system (e.g., HVAC, a heat exchanger, and/or a chiller).

One or more pumps 116 can pump the fluid 112, for example, to or from the reservoirs 102. For example, the pumps 116 can pump the fluid 112 around some or all of the environmental control system 100. For example, the pumps 116 can pump the fluid 112 with enough pressure to overcome pressure losses in the environmental control system 100. In various embodiments, the pumps 116 can be positioned in the interior of the reservoirs 102 (e.g., at least partially submerged in the fluid 112). However, the pumps 116 may be positioned on the exterior of the reservoir 102. The pumps 116 can pump the fluid 112 from the reservoir 102 (e.g., to the heat absorption device 104 and/or the heat rejection device 106) and/or can pump the fluid 112 into the reservoir 102. In some embodiments, multiple pumps 116 may be included in the environmental control system 100. For example, one or more pumps 116 can pump the fluid 112 out of the reservoirs 102 and/or one or more pumps 116 can pump the fluid 112 into the reservoirs 102. The pumps 116 can be or include a sump pump, a positive-displacement pump, a centrifugal pump, an axial pump, and/or any pump suitable for pumping fluid.

The pumps 116 can create high pressure areas 132 in the environmental control system 100. For example, the high pressure areas 132 can have the fluid 112 at a higher pressure than the fluid 112 in other parts of the environmental control system 100. The high pressure areas 132 can be areas between the pumps 116 and the heat absorption device 104 and/or the heat rejection device 106. In various embodiments, the high pressure areas 132 can be minimized in the environmental control system 100. For example, the high pressure areas 132 can be minimized to reduce that chance of high pressure leaks. Limiting the high pressure areas 132 can allow low pressure leaks to be contained with containment areas 210. Limiting the high pressure areas 132 can additionally or alternatively reduce the pressure that the pumps 116 need to generate. For example, the pumps 116 may not need to overcome a pressure drop through the whole system, just through the high pressure areas 132.

In various embodiments, the flow of the fluid 112 can be aided, for example, using gravity and/or a pumps 116. For example, the reservoirs 102 can be positioned at a lower elevation than the heat rejection device 106. The lower elevation can allow the fluid 112 to flow from the higher elevation to the lower elevation using gravity. Using gravity to aid the flow of the fluid 112 can increase the reliability of the environmental control system 100, for example, by reducing the amount of powered components (e.g., pumps) that are used in the system. The reservoir 102 may be positioned at a higher elevation than the heat rejection device 106 and a pumps 116 (e.g., a sump pump) can be used to pump the fluid 112 into the reservoirs 102.

Conduits 110 can connect various components of the environmental control system 100 with one another to allow the fluid 112 to flow between the components. For example, conduits 110 can connect the reservoirs 102 with the heat absorption device 104 and the heat rejection device 106. The conduits 110 can be or include a device suitable for transporting fluid. For example, the conduits 110 can be or include copper, steel, plastic, or any suitable material for transporting fluid. Multiple types of conduits 110 can be used in the environmental control system 100. For example, copper conduits may be used to transport the fluid 112 to the heat absorption device 104 and/or the heat rejection device 106 and plastic conduits may be used to transport the fluid 112 to the reservoirs 102.

In various embodiments, the environmental control system 100 can include a sensor 212. The sensor 212 can detect one or more characteristics associated with the conduits 110 and/or the fluid 112. For example, the sensor 212 can detect the flow rate of the fluid 112 in the conduit. The sensors 212 can detect the flow rate of the fluid 112 in the conduits 110. The flow rate of the fluid 112 can be used to determine if a leak has occurred in the environmental control system 100. The sensors 212 can additionally or alternatively detect a temperature of the environment 118. The sensors 212 can be or include a temperature sensor, a flow rate sensor, and/or any sensor suitable for use in an environmental control system.

The conduits 110 can be connected to one another and/or the components of the environmental control system 100, for example, via an inlet or outlet port. The conduits 110 can be positioned within the data center 200 to reduce the connections.

The cold reservoir 102a can output fluid 112 to the heat absorption device 104, for example via conduit 108a. The heat absorption device 104 can use the fluid 112 to cool airflow. For example, the heat absorption device 104 can cool the airflow in the data center 200. In various embodiments, the heat absorption device 104 can be coupled with the data center 200 via one or more air channels 206. The air channels 206 can feed air from the environment 204 to the heat absorption device 104 and/or can feed air from the heat absorption device 104 to the environment 204. The air can additionally or alternatively be fed to and/or from the environment 118 to the environment 204. In some embodiments, the heat absorption device 104 can additionally or alternatively receive and/or output air into the environment 118. For example, the heat absorption device 104 can cool the airflow in the environment 118. The airflow can flow, for example, from the environment 118 to environment 204.

The pumps 116 can cause the fluid 112 to flow through conduit 108a to the heat absorption device 104. However, the fluid 112 may flow through several conduits to the heat absorption device 104. The fluid 112 flowing to the heat absorption device 104 can be at a temperature below the ambient temperature of the environment 204. In various embodiments, the fluid 112 can be cooled to a temperature below the ambient temperature of the environment 204 (e.g., by booster system 126). The heat absorption device 104 can receive the fluid 112 and cool the air in the environment 204. For example, the heat absorption device 104 can intake air (e.g., from the environment 204), cool the air, and output the cool air (e.g., back into the environment 204). In various embodiments, the heat absorption device 104 can intake and/or output the air through one or more vents positioned in the data center 200. In some embodiments, a portion of the heat absorption device 104 can be positioned outside of the environment 204 and/or the data center 200. For example, the heat absorption device 104 can intake air from outside the environment 204 through one or more vents positioned outside of the environment 204. Cooling of the air can cause the fluid 112 to have a higher temperature exiting the heat absorption device 104 than entering the heat absorption device 104. The heat absorption device 104 can be or include a heat exchanger, an air handling unit, a computer room air handling unit, an air handling unit with chilled water coil, and/or any cooling unit suitable for providing cool air to a data center 200.

The fluid 112 can be output from the heat absorption device 104 and flow to the hot reservoir 102b via conduit 110b. In various embodiments, the conduit 110b can be positioned to extend through a portion of the cold reservoir 102a. For example, the conduit 110b can extend down through the cold reservoir 102a to the hot reservoir 102b. However, the conduit 110b can be positioned on the exterior of the cold reservoir 102a. The fluid 112 traveling through the conduit 110b extending through the cold reservoir 102a can cool the fluid 112. For example, the fluid 112 entering the hot reservoir 102b can be at a lower temperature than the fluid 112 exiting the heat absorption device 104.

The fluid 112 in the hot reservoir 102b can flow from the hot reservoir 102b to the heat rejection device 106. For example, the fluid 112 can flow from the hot reservoir 102b through conduit 110c. The fluid 112 flowing from the hot reservoir 102b through the conduit 110c to the heat rejection device 106 can be cooled by the fluid 112 in the cold reservoir 102a. For example, the temperature of the fluid 112 leaving the hot reservoir 102b can be higher than the temperature of the fluid 112 entering the heat rejection device 106.

The heat rejection device 106 can receive and reduce the temperature of the fluid 112. The heat rejection device 106 can cool the fluid 112 to a temperature lower than the temperature of the fluid 112 when the fluid 112 is received. The cooling of the fluid 112 can include outputting air (e.g., air at a temperature greater than the temperature of the air being output by the heat absorption device 104). The air can be output outside environment 118. For example, the air can be output into the surrounding environment. For example, the air can be output outside the environment 204 and/or the data center 200. In some embodiments, the heat rejection device 106 can include a portion positioned outside the environment 204 and/or the data center 200. The heat rejection device 106 can be or include a dry fluid cooler, a heat exchanger, and/or any device suitable for cooling the fluid 112.

In various embodiments, the heat absorption device 104 and/or the heat rejection device 108 can be positioned within containment areas 210. The containment areas 210 can contain fluid 112 that may leak from the environmental control system 100. For example, the containment areas 210 can be or include a drain pan with a drain that can direct the leaking fluid 112 into the cold reservoir 102a and/or the hot reservoir 102b. The fluid 112 can flow from the containment areas 210 to the hot and cold reservoirs 102a and 106 via conduits 110 (e.g., via conduits 110d and 110e). In various embodiments, the hot and cold reservoirs 102a and 106 can be positioned at a lower elevation than the containment areas 210. The lower elevation can allow the fluid 112 to drain into the cold reservoir 102a and/or the hot reservoir 102b without the use of a pump (e.g., a sump pump). Containing the leaking fluid 112 can allow the environmental control system 100 to continue to operate, for example, until the leak can be fixed.

In traditional systems, leaking fluid can cause the system to fail without immediate intervention (e.g., without immediate maintenance to fix the leak). Whereas, in the present system, leaks may occur and can be contained using containment areas 210. Some or all of the leaking fluid can be reintroduced back into the system (e.g., via draining the fluid 112 into the reservoir 102) and can allow the environmental control system 100 to continue to operate. For example, the environmental control system 100 can continue to operate until routine maintenance is performed to fix the leak.

In various embodiments, the cold reservoir 102a and/or the hot reservoir 102b can include an opening 214 that can allow the pressure inside the reservoir 102 to remain at or near the pressure of the environment 204. The pressure in the reservoir 102 being at or near the pressure of the environment 204 can allow the environmental control system 100 to operate at a lower pressure than traditional environmental control systems. For example, traditional systems can have a closed loop system that pressurizes the fluid in the system to around 125 pounds per square inch (psi). The high pressure in the closed system can cause fluid leaking from the system to spray into the surrounding environment which can be difficult to contain and can deplete the fluid in the system. The environmental control system 100 may have low pressure leaks, however unlike the traditional systems, the fluid can flow from the system compared to spraying from the system. The fluid 112 leaking from the environmental control system 100 can be contained, for example, using the containment areas 210 and reintroduced into the environmental control system 100 via the cold reservoir 102a and/or the hot reservoir 102b.

In various embodiments, the environmental control system 100 can include a computer system 220. The computer system 220 can communicate information and/or instructions associated with the environmental control system 100. For example, the computer system 220 can be in communication with the control pumps 116, the heat absorption device 104, the heat rejection device 106, the booster system 126, and/or respective components associated with such elements. In various embodiments, the computer system 220 can be or include an integrated circuit executing a software program or running a state machine. The computer system 220 can communicate via a wired or wireless connection (e.g., Bluetooth and/or Wi-Fi). The computer system 220 can include memory and a processor. The memory and the processor can be included in a single structure. However, the memory and/or processor may be part of a system of multiple interconnected devices.

The computer system 220 can receive data from the sensors 212, for example, temperature data associated with the environmental control system 100 and/or the data center 200. The computer system 220 can compare the temperature data with a threshold temperature. The comparison can be used to determine if the environmental control system 100 and/or if the booster system 126 needs to be turned on or off. For example, during a startup operation, the booster system 126 can be activated at full power. The power of the booster system 126 can be reduced the closer the detected temperature gets to the threshold temperature.

The memory can include any type of memory device that retains stored information when powered off. The memory can be or include electrically erasable and programmable read-only memory ("EEPROM"), flash memory, or any other type of non-volatile memory. In some examples, at least part of the memory can include a medium from which the processor can read instructions. A non-transitory computer-readable medium can include electronic, optical, magnetic, or other storage devices capable of providing the processor with computer-readable instructions or other program code. Non-limiting examples of a computer-readable medium include (but are not limited to) magnetic disk(s), memory chip(s), ROM, random-access memory ("RAM"), an ASIC, a configured processor, optical storage, or any other medium from which a computer processor can read instructions. The instructions can include processor-specific instructions generated by a compiler or an interpreter from code written in any suitable computer-programming language, including, for example, C, C++, C#, etc.

The processor can execute instructions stored in the memory to perform operations, for example, turning the booster system 126 on or off. The processor can include one processing device or multiple processing devices. Non-limiting examples of the processor include a Field-Programmable Gate Array ("FPGA"), an application-specific integrated circuit ("ASIC"), a microprocessor, etc.

Turning to FIG. 2B the environmental control system 100 is shown positioned within an environment of a server rack 202. However, the environmental control system 100 can be positioned in any suitable environment. The environmental control system 100 can cool the airflow in the environment and vent hot air into the surrounding environment. For example, the environmental control system 100 can cool the airflow in the server rack 202 and output air into the data center 200. The environmental control system 100 can include a heat absorption device 104 and a heat rejection device 106 positioned within the server rack 202. In various embodiments, the environmental control system 100 can include fluid 112 that flows between the heat absorption device 104 and the heat rejection device 106 (e.g., via conduits 110). A booster system 126 can be positioned between the heat absorption device 104 and the heat rejection device 106. The booster system 126 can be in contact with the heat absorption device 104 and/or the heat rejection device 106, however, some or all of the booster system 126 can be positioned a distance away from the heat absorption device 104 and/or the heat rejection device 106. The booster system 126 can include a cooling device 128 and/or a heating device 130. The booster system 126 can increase the temperature differential between the heat absorption device 104 and the heat rejection device 106 (e.g., the booster system 126 can increase the temperature of the heat absorption device 104 and decrease the temperature of the heat rejection device 106).

In various embodiments, the booster system 126 can be or include a Stirling engine. In such embodiments, the cooling device 128 can be or include a compression cylinder, the heating device 130 can be or include an expansion cylinder, and the cooling device 128 and the heating device 130 can be connected via a conduit 110. Fluid 112 can flow and be contained between the cooling device 128 and the heating device 130. A force (e.g., a mechanical force) can be applied to the heating device 130 and/or the cooling device 128. The force can cause a temperature change in the heating device 130 and/or the cooling device 128. For example, the force can cause the cooling device 128 to cool and/or cause the heating device 130 to heat.

In further embodiments, the booster system 126 can be or include a piezoelectric cooler. The cooling device 128 can be or include a first side of the piezoelectric cooler (e.g., a cool side) and the heating device 130 can be or include a second side of the piezoelectric cooler (e.g., a hot side). The piezoelectric cooler can receive an electrical current, for example, from the server rack 202. The current can cause the cooling device 128 to cool and the heating device 130 to heat.

Figure 3:
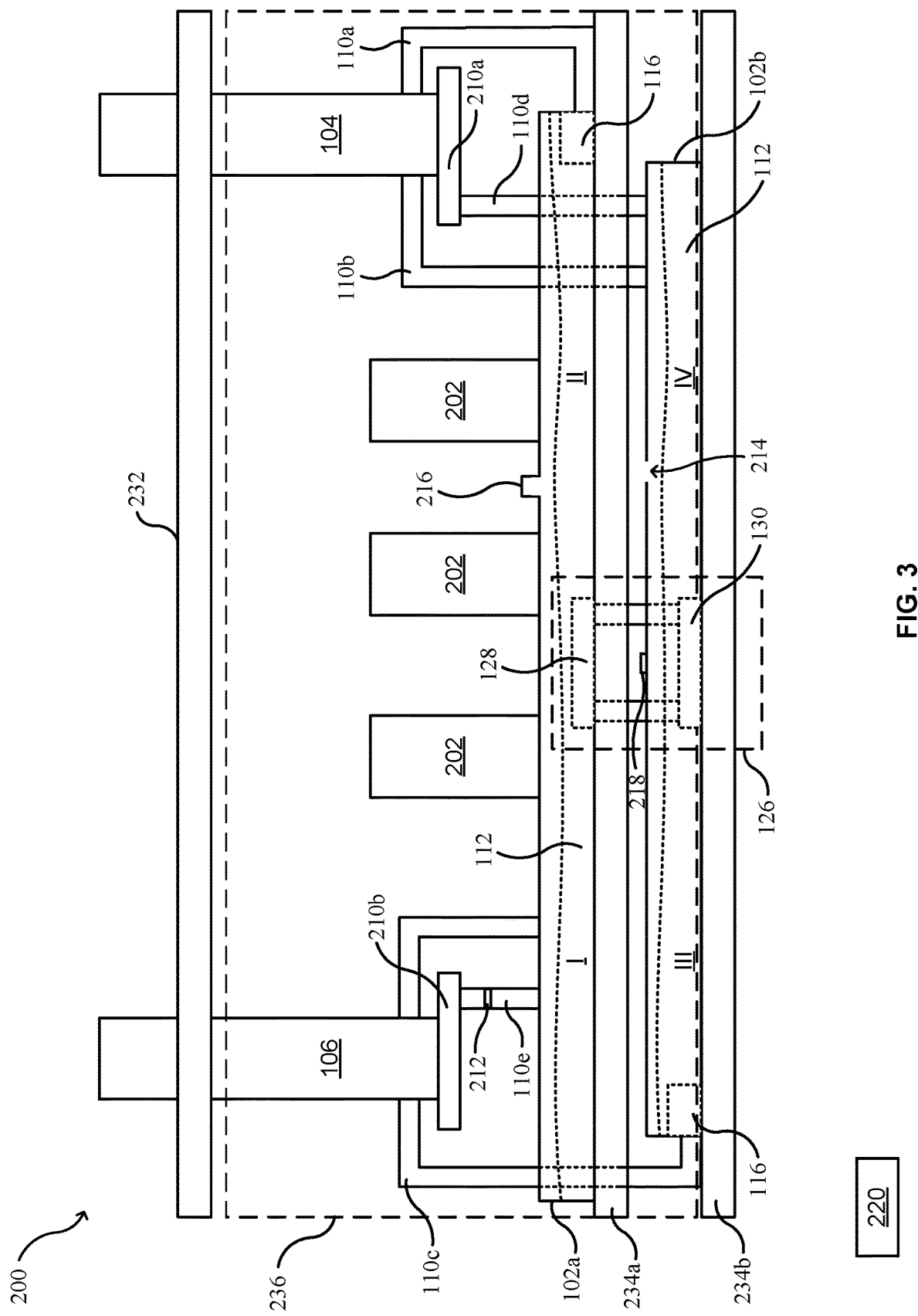
FIG. 3 illustrates the environmental control system of FIG. 1 for use with a data center, in accordance with various embodiments.

Turning to FIG. 3, an environmental control system 100 is shown positioned in a data center 200. The server racks 202 are shown positioned above the reservoirs 102, however, the server racks 202 may be positioned adjacent to the reservoirs 102. Additionally or alternatively, the reservoirs 102 are shown on different levels of flooring, however, the reservoirs 102 may be positioned on the same level, for example, adjacent to one another. Various embodiments of the disclosed technologies can be used in buildings with or without plenum beneath the floor on which the server racks sit.

The data center 200 can separate the environment 236 from the surrounding environment. For example, the data center 200 can include a roof 232 and a floor 234 that can separate the environment 204 from the surrounding environment. In various embodiments, the data center 200 can include multiple floors. For example, an upper floor 234a can support the server racks 202 and/or allow a technician to access the server racks 202 and a lower floor 234b can separate the environment 236 from the ground and/or support components of the environmental control system 100 (e.g., a reservoir 102). In some embodiments, a vent 216 can extend into the environment 236 and allow the pressure inside the reservoir 102 to be the same as or similar to the pressure in the environment 236.

The heat absorption device 104 can cool the airflow in the data center 200, for example, by taking in air from the environment 236 and outputting air back into the environment 236. However, the heat absorption device 104 can intake air from a surrounding environment (e.g., an environment outside the data center 200). The heat rejection device 106 can output air (e.g., heated air) into the environment outside of the data center 200. This air can be dispersed into the outside environment and/or may be cooled by the heat absorption device 104 which can cool the air for flowing into the data center 200.

Figure 4:
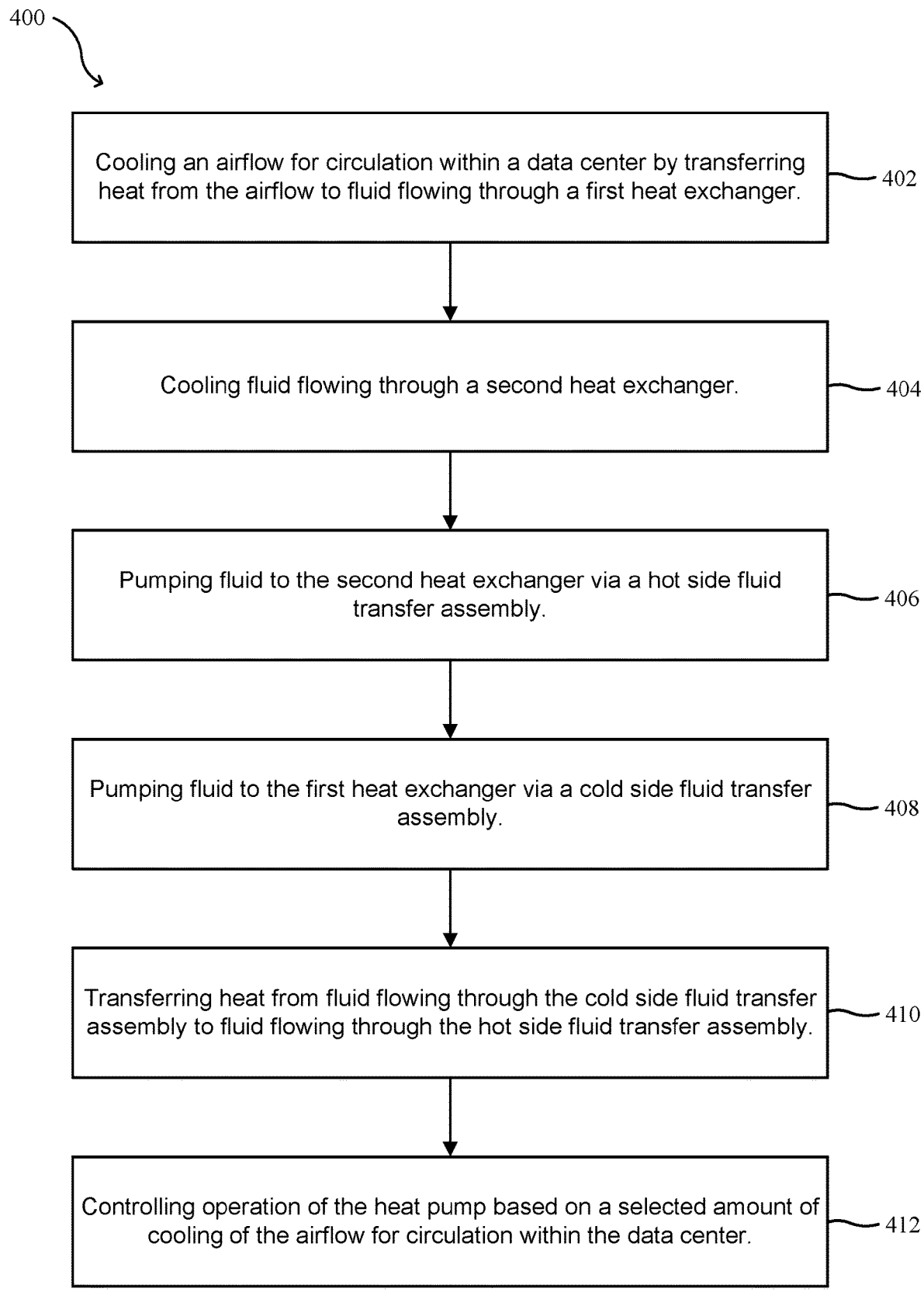
FIG. 4 is a flowchart illustrating a process for controlling an environment using the environmental control system of FIG. 1.

Turning to FIG. 4, a flowchart illustrating a process 400 for controlling an environment using the environmental control system 100 of FIG. 1. The process 400 at block 402 can include cooling an airflow for circulation within a data center (e.g., data center 200) by transferring heat from the airflow to water (e.g., fluid 112) flowing through a first heat exchanger (e.g., a heat absorption device 104). Cooling the airflow can include the heat absorption device 104 receiving the fluid 112 from the cold reservoir 102a. The heat absorption device 104 can transfer heat from the air in the data center 200 to the fluid 112 in the heat absorption device 104.

The process 400 at block 404 can include cooling the fluid flowing through the second heat exchanger (e.g., the heat rejection device 106). The fluid 112 flowing through the heat rejection device 106 can be cooled by the heat rejection device 106. The heat rejection device 106 can cool the fluid 112 by transferring the heat from the fluid 112 into the air, for example, by venting the hot air from the heat rejection device 106 out of the environment 118.

The process 400 at block 406 can include pumping the fluid 112 to the heat rejection device via a hot side fluid transfer assembly (e.g., the hot reservoir 102b). The fluid 112 can be received by the hot reservoir 102b from the heat absorption device 104. The fluid 112 can flow from the heat absorption device 104 through the hot reservoir 102b. The fluid 112 can flow from the heat absorption device 104 at an atmospheric pressure. A pump (e.g., pumps 116) can pump the fluid 112 from the hot reservoir 102b to the heat rejection device 106.

The process 400 at block 408 can include pumping the fluid 112 to the heat absorption device 104 via a cold side fluid transfer assembly (e.g., the cold reservoir 102a). The fluid 112 can flow into the cold reservoir 102a from the heat rejection device 106. The fluid 112 can flow from the heat rejection device 106 at atmospheric pressure. A pump 116 can pump the fluid 112 from the cold reservoir 102a to the heat absorption device 104.

The process 400 at block 410 can include transferring heat from the fluid 112 through the cold reservoir 102a to the fluid 112 flowing through the hot reservoir 102b. Transferring the heat can include using the booster system 126. Transferring the heat can cause the temperature of the fluid 112 in the cold reservoir 102a to fall and can cause the temperature of the fluid 112 in the hot reservoir 102b to rise. The increase in the difference between the hot fluid 112 and the cold fluid 112 can increase the efficiency of the environmental control system 100.

The process 400 at block 412 can include controlling operation of the heat pump (e.g., booster system 126) based on a selected amount of cooling of the airflow for circulation within the data center 200. Controlling operation can include detecting the temperatures of the environments 118, 204, and/or 236. The temperatures of can be compared with a set value (e.g., a threshold value). Based on the difference between the temperatures and the set value, the booster system 126 can be activated or de-activated. Additionally or alternatively, the booster system 126 can increase the cooling power of the environmental control system 100.

In various embodiments controlling operation of the booster system 126 can include turning off and/or reducing the cooling power of the booster system 126. For example, the booster system 126 can be turned off and/or reduced based on the temperatures of the environments 118, 204, and/or 236. For example, as the temperature of the environments begins to reach the set point temperature the, the power of the booster system 126 can be reduced. Once the temperatures of the environments reach the set point, the booster system 126 can be completely turned off and/or put into a lower power or standby state.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments are described herein, including the many modes known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A cooling system for a data center, the cooling system comprising:
   a heat absorption device comprising a first heat exchanger and a first fan, wherein the heat absorption device is configured to cool an airflow for circulation within the data center by transferring heat from the airflow to fluid flowing through the first heat exchanger;
   a heat rejection device comprising a second heat exchanger and a second fan, wherein the heat rejection device is configured to cool fluid flowing through the second heat exchanger;
   a circulation assembly comprising a hot side fluid transfer assembly, a cold side fluid transfer assembly, and a circulation pump operable to pump fluid from the first heat exchanger to the second heat exchanger via the hot side fluid transfer assembly and from the second heat exchanger to the first heat exchanger via the cold side fluid transfer assembly, wherein the hot side fluid transfer assembly comprises a hot side reservoir, a first hot side conduit for transporting fluid from the first heat exchanger to the hot side reservoir, and a second hot side conduit for transporting fluid from the hot side reservoir to the second heat exchanger and the cold side fluid transfer assembly comprises a cold side reservoir, a first cold side conduit for transporting fluid from the second heat exchanger to the cold side reservoir, and a second cold side conduit for transporting fluid from the cold side reservoir to the first heat exchanger;
   a heat pump operable to transfer heat from fluid flowing through the cold side fluid transfer assembly to fluid flowing through the hot side fluid transfer assembly; and
   a controller operatively connected with the first fan, the second fan, the circulation pump, and the heat pump, wherein the controller is configured to control speed of the first fan, speed of the second fan, speed of the circulation pump, and heat transfer rate of the heat pump based on a selected amount of cooling of the airflow for circulation within the data center.

2. The cooling system of claim 1, wherein the hot side fluid transfer assembly comprises a first reservoir configured to receive the heat from the heat pump and contain the fluid flowing through the hot side fluid transfer assembly.

3. The cooling system of claim 2, wherein the cold side fluid transfer assembly comprises a second reservoir configured to expel heat to the heat pump and contain the fluid flowing through the cold side fluid transfer assembly.

4. The cooling system of claim 3, wherein the heat absorption device or the heat rejection device further comprises a drain device configured to flow fluid to the first or second reservoir.

5. The cooling system of claim 1, wherein the hot side reservoir and the cold side reservoir are at atmospheric pressure.

6. A method, comprising:
   cooling an airflow by transferring heat from the airflow to fluid flowing through a first heat exchanger;
   cooling fluid flowing through a second heat exchanger;
   pumping fluid to the second heat exchanger via a hot side fluid transfer assembly;
   pumping fluid to the first heat exchanger via a cold side fluid transfer assembly;
   transferring heat from fluid flowing through the cold side fluid transfer assembly to fluid flowing through the hot side fluid transfer assembly; and
   controlling operation of a heat pump based on a selected amount of cooling of the airflow for circulation, wherein the hot side fluid transfer assembly comprises a hot side reservoir, a first hot side conduit for transporting fluid from the first heat exchanger to the hot side reservoir, and a second hot side conduit for transporting fluid from the hot side reservoir to the second heat exchanger and the cold side fluid transfer assembly comprises a cold side reservoir, a first cold side conduit for transporting fluid from the second heat exchanger to the cold side reservoir, and a second cold side conduit for transporting fluid from the cold side reservoir to the first heat exchanger.

7. The method of claim 6, wherein the cold side fluid transfer assembly comprises a cold reservoir at an atmospheric pressure.

8. The method of claim 7, wherein the hot side fluid transfer assembly comprises a hot reservoir at an atmospheric pressure.

9. The method of claim 6, wherein controlling operation of the heat pump comprises sensing a temperature within a data center and comparing the temperature with a set point temperature.

10. The method of cooling of claim 6, wherein cooling an airflow comprises circulating air within an environment.

11. A cooling system comprising:
a first heat exchanger configured to cool an airflow by transferring heat from the airflow to fluid flowing through the first heat exchanger;
a second heat exchanger configured to cool fluid flowing through the second heat exchanger;
a circulation assembly comprising a hot side fluid transfer assembly and a cold side fluid transfer assembly, the circulation assembly configured to output fluid to the second heat exchanger via the hot side fluid transfer assembly and to output fluid to the first heat exchanger via the cold side fluid transfer assembly; and
a heat transfer device operable to transfer heat from fluid flowing through the cold side fluid transfer assembly to fluid flowing through the hot side fluid transfer assembly, wherein the hot side fluid transfer assembly comprises a hot side reservoir, a first hot side conduit for transporting fluid from the first heat exchanger to the hot side reservoir, and a second hot side conduit for transporting fluid from the hot side reservoir to the second heat exchanger and the cold side fluid transfer assembly comprises a cold side reservoir, a first cold side conduit for transporting fluid from the second heat exchanger to the cold side reservoir, and a second cold side conduit for transporting fluid from the cold side reservoir to the first heat exchanger.

12. The cooling system of claim 11, wherein the first heat exchanger comprises a first fan and the second heat exchanger comprises a second fan.

13. The cooling system of claim 12, further comprising a controller operatively connected with the first fan, the second fan, and the heat transfer device, wherein the controller is configured to control speed of the first fan, speed of the second fan, and heat transfer rate of the heat transfer device based on a selected amount of cooling of the airflow.

14. The cooling system of claim 11, wherein the circulation assembly further comprises a circulation pump operable to pump fluid to the first and second heat exchangers.

15. The cooling system of claim 11, wherein the hot side fluid transfer assembly comprises a first reservoir and the cold side fluid transfer assembly comprises a second reservoir.

16. The cooling system of claim 15, wherein the first and second reservoirs are at atmospheric pressure.

17. The cooling system of claim 15, wherein the first heat exchanger comprises a first drain pan configured to flow fluid to the first or second reservoir and the second heat exchanger comprises a second drain pan configured to flow fluid to the first or second reservoir.

18. The cooling system of claim 11, wherein the heat transfer device comprises one or more of a chiller, a heat pump, a thermoelectric cell, or a Peltier device.

19. The cooling system of claim 18, wherein the heat transfer device comprises a hot side engaged with the hot side fluid transfer assembly and a cold side engaged with the cold side fluid transfer assembly.

* * * * *